United States Patent [19]

Akamatsu

[11] Patent Number: 5,768,290

[45] Date of Patent: Jun. 16, 1998

[54] SEMICONDUCTOR INTEGRATED CIRCUIT DEVICE INCORPORATING FUSE-PROGRAMMABLE PASS/FAIL IDENTIFICATION CIRCUIT AND PASS/FAIL DETERMINATION METHOD THEREOF

[75] Inventor: Hiroshi Akamatsu, Hyogo, Japan

[73] Assignee: Mitsubishi Denki Kabushiki Kaisha, Tokyo, Japan

[21] Appl. No.: 831,034

[22] Filed: Apr. 1, 1997

[30] Foreign Application Priority Data

Oct. 22, 1996 [JP] Japan ................... 8-279366

[51] Int. Cl.$^6$ .................................. G06F 11/00
[52] U.S. Cl. .................................. 371/22.4
[58] Field of Search .................. 371/22.4, 22.1, 371/22.2, 22.5; 365/201, 227, 228

[56] References Cited

U.S. PATENT DOCUMENTS 4,896,055  1/1990  Fujii et al. ................ 365/201
5,617,366  4/1997  Yoo ......................... 365/201

FOREIGN PATENT DOCUMENTS 5-54694    3/1993  Japan.
5-188118   7/1993  Japan.

*Primary Examiner*—Vincent P. Canney
*Attorney, Agent, or Firm*—McDermott, Will & Emery

[57] ABSTRACT

A semiconductor integrated circuit device includes a test mode circuit for generating a fuse blow test mode activation signal according to a signal applied to a predetermined terminal, a pass/fail confirmation circuit including a fuse element and providing a signal of a logic level according to a conduction/non-conduction state of this fuse element when the fuse blow test mode activation signal from the test mode circuit is active, and an output conversion circuit for converting an output signal of the pass/fail confirmation circuit into a signal observable at a predetermined external terminal. The fuse element included in the pass/fail confirmation circuit is blown out by a laser only when the semiconductor integrated circuit device is determined to be an acceptable product at the test of the wafer level. After packaging, determination of whether there is a cut off failure in any internal fuse element can easily be made in non-destructive manner.

13 Claims, 10 Drawing Sheets

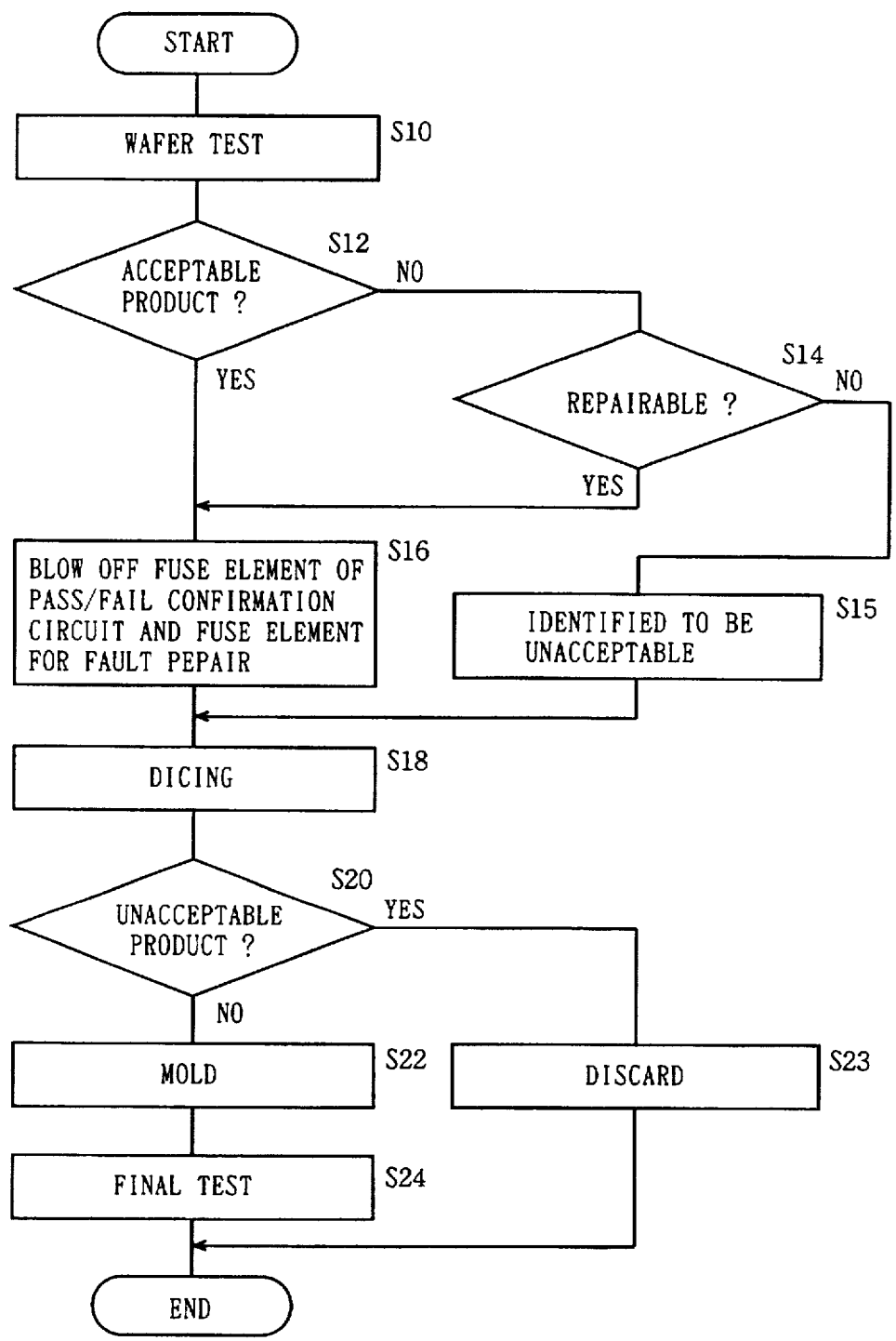

FIG. 8
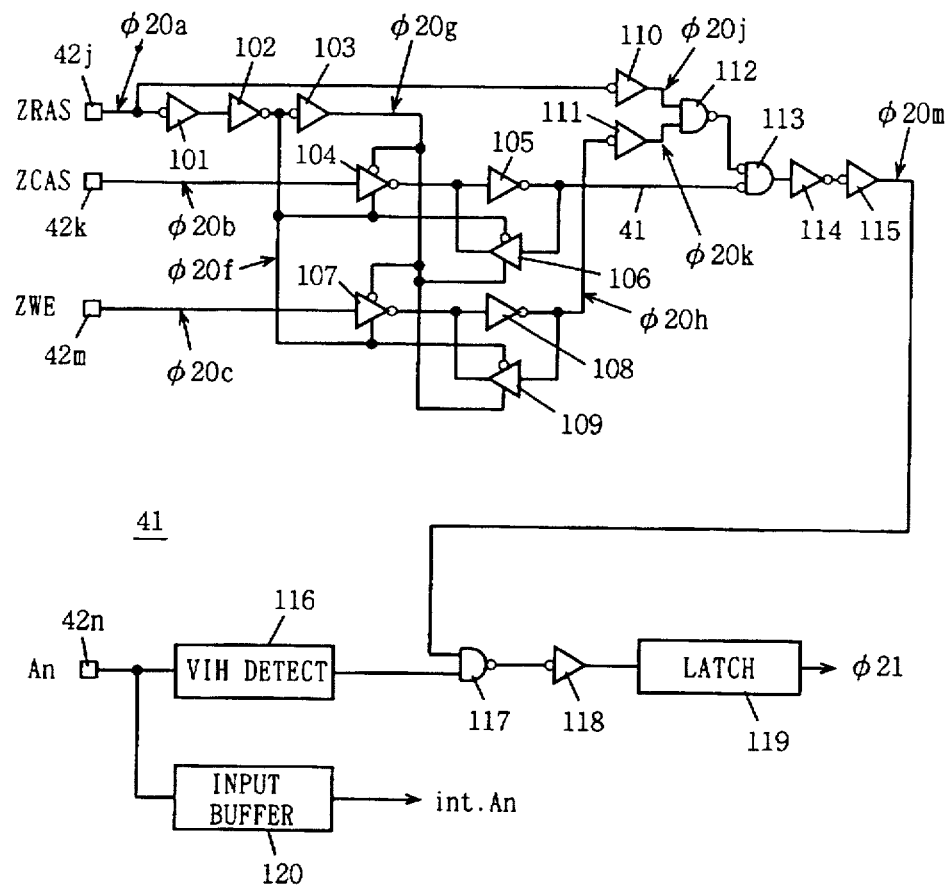
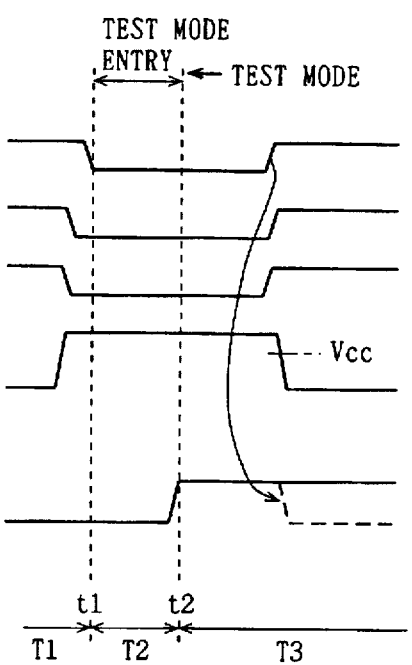
FIG. 9A ZRAS
FIG. 9B ZCAS
FIG. 9C ZWE
FIG. 9D An
FIG. 9E φ21

SEMICONDUCTOR INTEGRATED CIRCUIT DEVICE INCORPORATING FUSE-PROGRAMMABLE PASS/FAIL IDENTIFICATION CIRCUIT AND PASS/FAIL DETERMINATION METHOD THEREOF

BACKGROUND OF THE INVENTION

1. Field of the Invention

The present invention relates to pass/fail determination technique for a semiconductor integrated circuit device, and more particularly, to pass/fail determination technique for a semiconductor integrated circuit device having a fuse blow out step in the manufacturing process.

2. Description of the Background Art

FIG. 1 shows a structure of main components of a conventional semiconductor integrated circuit device disclosed in Japanese Patent Laying-Open No. 5-188118, for example. Referring to FIG. 1, a semiconductor integrated circuit device 10 includes a function circuit 11 for implementing a predetermined function, and a failurization circuit 14 provided at a signal path between a particular signal input terminal (pad) 12 and function circuit 11. This semiconductor integrated circuit device 10 is formed on a wafer not shown. A plurality of semiconductor integrated circuit devices 10 shown in FIG. 1 are provided on one wafer.

Failurization circuit 14 is a fuse-programmable circuit, functioning to force function circuit 11 into an inactive state when semiconductor integrated circuit device 10 is in failure, as will be described in detail afterwards. Failurization circuit 10 includes an inverter circuit 16 receiving a particular signal φ1 which is a chip select signal, for example, applied via a signal input terminal (pad) 12 to buffer and invert the received signal, a pass/fail program circuit 18 which is fuse-programmable for forcefully setting an output signal φ2 of inverter circuit 16 to an inactive state according to whether the semiconductor integrated circuit device is defective/non-defective, a latch circuit 20 for inverting and latching an output signal φ3 of pass/fail program circuit 18, and an inverter circuit 22 for inverting the output signal of latch circuit 20. An output signal φ4 of inverter circuit 22 is applied to an internal input node 27 of function circuit 11 corresponding to input terminal 12.

Pass/fail program circuit 18 includes a p channel MOS transistor (insulating gate type field effect transistor) 18a connected between a power supply node Vdd (power supply voltage and node indicated by the same reference character), receiving output signal φ2 of inverter circuit 16 at its gate, a fusible link element (referred to as "fuse element" hereinafter) 18b connected to an internal output node N1, and an n channel MOS transistor 18c connected between fuse element 18b and a ground node for receiving output signal φ2 of inverter circuit 16 at its gate.

Latch circuit 20 includes an inverter circuit 20a receiving output signal φ3 of pass/fail program circuit 18, and a p channel MOS transistor 20b connected between power supply node Vdd and internal output node N1 for receiving an output signal of inverter circuit 20a at its gate.

Function circuit 11 is, for example, a memory circuit, and is activated to execute a predetermined function when signal φ4 applied to input node 27 is activated. A test step carried out in the manufacturing process of semiconductor integrated circuit device 10 will be briefly described before describing a program operation of the semiconductor integrated circuit device of FIG. 1.

FIG. 2 is a flow chart showing a pass/fail determination sequence in a manufacturing process of the semiconductor integrated circuit device of FIG. 1. Referring to FIG. 2, testing at the wafer level (wafer test) is carried out (step S1) following the simultaneous formation of a plurality of semiconductor integrated circuit devices 10 of FIG. 1 on a wafer. In this wafer test, all the input/output terminals of semiconductor integrated circuit device 10 are tested on whether they function properly or not. When this semiconductor integrated circuit device is a memory device, for example, a test of whether data is written/read out properly is carried out.

According to the result of the test at the wafer level, fuse element 18b in pass/fail program circuit 18 is blown out with a laser beam for any integrated semiconductor device 10 determined as having an unrepairable defect (step S2). When a repairable defect is detected, the circuit with defection is substituted by an internal redundant circuit. This substitution of a redundant circuit is generally carried out with a fuse-programmable circuit.

When testing at the wafer level is completed and the step for carrying out a fuse program to determine a pass/failure is completed, the semiconductor integrated circuit devices on the wafer are separated into chips in a dicing step. The semiconductor integrated circuit device formed as a chip is packaged (molded) in a mold step S3. Following completion of mold step S3, final testing for each individual semiconductor integrated circuit device is carried out (step S4). In this final test step S4, a signal is input/output via an external pin terminal for each semiconductor integrated circuit device to carry out a function test similar to that carried out at the wafer level with respect to each input/output terminal (a pin terminal is electrically connected to respective internal signal input/output pads: when non-defective).

In this final test step S4, it is not necessary to test the semiconductor integrated circuit device determined as an unacceptable product at the wafer level. Failurization circuit 1 shown in FIG. 14 is used to carry out this pass/fail identification.

It is now assumed that the semiconductor integrated circuit device is a semiconductor memory device, and a particular input signal φ1 applied to signal input terminal 12 shown in FIG. 1 is a chip select signal ZCS which places the semiconductor integrated circuit device into a selected state. According to this assumption, input terminal 27 of function circuit 11 shown in FIG. 1 is a chip select signal input node. When the signal applied to input node 27 attains an L level (logical low), function circuit 11 is rendered active to execute a predetermined function according to an externally applied signal not shown.

When fuse element 18b in pass/fail program circuit 18 of semiconductor integrated circuit device 10 is not blown in final test step S4, this semiconductor integrated circuit device is determined to be an acceptable product in the wafer level test. In this state, pass/fail program circuit 18 operates as a CMOS (complementary MOS) inverter circuit. By setting signal φ1 applied to input terminal 12 to an L level, output signal φ2 of inverter circuit 16 attains an H level (logical high), whereby n channel MOS transistor 18c is rendered conductive, and p channel MOS transistor 18a is rendered non-conductive. In response, the output signal of inverter circuit 20a is driven to an H level, and output signal φ4 of inverter circuit 22 is driven to an L level. When signal φ4 applied to input node 27 attains an L level, function circuit 11 is rendered active to carry out a predetermined function according to a signal applied to another signal input node (pad) that is not shown. The executed result is provided to an output pad (output terminal) not shown.

When signal φ1 applied to input terminal 12 attains an H level in a state where fuse element 18b is not blown off, output signal φ2 of inverter circuit 16 is driven to an L level, whereby p channel MOS transistor 18a is rendered conductive and n channel MOS transistor 18c is rendered non-conductive. As a result, output signal φ3 of pass/fail program circuit 18 attains an H level. In response, the output signal of inverter circuit 20a attains an L level, and output signal φ4 of inverter circuit 22 attains an H level.

When the output signal of inverter circuit 20a attains an L level, p channel MOS transistor 20b conducts to maintain signal φ3 at an H level. Function circuit 11 attains a non-selected state when signal φ4 applied to input node 27 attains an H level, and is maintained at a standby state. More specifically, activation/inactivation of function circuit 11 is controlled according to the logic level (H/L) of signal φ1 applied to input terminal 12 when fuse element 18b is in a non-blown state.

When the semiconductor integrated circuit device is detected to be an unacceptable product and fuse element 18b is blown out in the unacceptable product fuse blow out step S2, n channel MOS transistor 18c is disconnected from internal output node N1. Output signal φ2 of inverter circuit 16 that sets signal φ1 applied to input terminal (pad) 12 to an H level at initialization is driven to an L level, whereby p channel MOS transistor 18a conducts. Signal φ3 of node N1 attains an H level. In this case, the output signal of inverter circuit 20a attains an L level, and p channel MOS transistor 20b conducts. Signal φ3 is maintained at the H level of power supply voltage Vdd level. In this case, output signal φ4 of inverter circuit 22 attains an H level, and function circuit 11 maintains a non-selected state, i.e. in a disable state.

Even when signal φ1 is set at an L level and output signal φ2 of inverter circuit 16 attains an H level under such a state, signal φ3 is maintained at an H level by latch circuit 20 since n channel MOS transistor 18c is disconnected from internal output node N1. Therefore, signal φ4 applied to input node 27 of function circuit 11 maintains an inactive state of an H level. Thus, function circuit 11 maintains a non-selected state.

More specifically, function circuit 11 is placed in an inactive state (non-selected state) fixedly by blowing off fuse element 18b, so that semiconductor integrated circuit device 10 is placed in a completely failing state (no operation according to an external control signal is carried out). Therefore, in final test step S4, fuse element 18b is blown out to completely inhibit the operation of semiconductor integrated circuit device 10 determined to be completely faulty at the chip level, and a defective device can readily be distinguished from a semiconductor integrated circuit device that operates properly. By carrying out testing for a particular input terminal 27 of function circuit 11, determination can be made of whether that semiconductor integrated circuit device is an acceptable product or not. It is not necessary to carry out a similar testing on all the remaining terminals to make pass/fail determination for all the terminals. The pass/fail identification in the final test process can be facilitated and the time required for testing is reduced.

The energy of the laser beam used for blowing off the failurization fuse element 18b of the semiconductor integrated circuit device having an unrepairable defect is set to an optimum condition for semiconductor integrated circuit device 10 to be processed. The optimum value of the laser energy is set according to a fuse element produced under the condition of a certain manufacturing parameter as the reference. However, the optimum value of the laser beam energy for blowing off a fuse element can be offset from a preset optimum value when the fuse element has its film thickness, width, and material varied due to variation in the process parameters in mass production. There is a case where fuse element 18b is not completely blown off due to such deviation from the set value of the optimum energy value to result in a conductive state being maintained.

Furthermore, variation in the energy and irradiation position may occur due to some trouble of the apparatus per se from which a laser beam is emitted. There is a possibility of the case of cut off failure where the fuse element which should be blown off completely is blown off insufficiently or maintains a conductive state.

The conventional pass/fail determination method of a semiconductor integrated circuit device lacks means to estimate cut off failure of a fuse element after packaging in a non-destructive manner. When fuse element 18b which should be blown off completely is not blown off and cut off failure occurs because of a faulty product, there is a case where the unacceptable product cannot be detected just with the examination of a particular element 12. In such a case, testing must be repeated for all the inspection items as for an acceptable product. Thus, there was a problem that the testing time cannot be shortened effectively.

When many defects are detected in the final test, failure analysis is carried out. In this analysis, determination of whether the error is caused by defect in the fuse blow out in the fuse-programmable circuit for substituting of redundant circuitry for the defective circuit portion can only be carried out by melting, the mold resin that seals the semiconductor integrated circuit device for observation by a microscope. This fault analysis was time consuming, and the procedure thereof was tedious.

In order to overcome the above-described problems, an approach of providing an exclusive test terminal can be considered to test conduction/non-conduction of a fuse element for pass/fail identification. However, the number of pin terminals and also the chip area will be increased. The pin arrangement must be changed due to the extra test terminal, leading to the problem that compatibility with the industry standard cannot be maintained.

SUMMARY OF THE INVENTION

An object of the present invention is to provide a semiconductor integrated circuit device and a pass/fail determination method that can carry out pass/fail determination more easily.

Another object of the present invention is to provide a semiconductor integrated circuit device and a pass/fail determination method thereof that can easily determine non-conduction of an internal fuse element in a non-destructive manner.

A further object of the present invention is to provide a semiconductor integrated circuit device and a determination method thereof that can easily determine conduction/non-conduction of a pass/fail determination fuse-programmable circuit without increase any extra pin terminals.

A semiconductor integrated circuit device according to the present invention includes a fuse-programmable pass/fail confirmation circuit that has a link element that is fused out when determination is made as being an acceptable product by the result of testing at the wafer level.

Preferably, a conversion circuit is provided that applies an output signal of the pass/fail confirmation circuit to an external terminal in an observable manner.

A pass/fail determination method of a semiconductor integrated circuit device of the present invention includes the step of blowing off a link element in a fuse-programmable pass/fail confirmation circuit incorporated therein when determination is made as being an acceptable product by testing at the wafer level.

The link element of a pass/fail confirmation circuit of a semiconductor integrated circuit device determined to be an acceptable product at the wafer level is cut off. The semiconductor integrated circuit device determined to be an acceptable product is packaged to be subjected to a final test process at the chip unit level. In this final test process, only the semiconductor integrated circuit device determined to be an acceptable product is tested. It is therefore not particularly necessary to distinguish pass/fail at this stage.

When a defective product is found at the final test procedure, determination of whether that defect is caused by cut off failure of a link element in a fuse-programmable circuit in which the defect is included can be made easily by observing the output signal of the pass/fail confirmation circuit from the outside world at the time of failure analysis.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a flow chart showing a pass/fail determination sequence of a semiconductor integrated circuit device according to the present invention.

FIG. 8 shows an example of a structure of a test mode circuit of FIGS. 5 and 6.

FIGS. 9A–9E are waveform diagrams showing an operation of a test mode circuit of FIG. 8.

DESCRIPTION OF THE PREFERRED EMBODIMENTS

Figure 1:
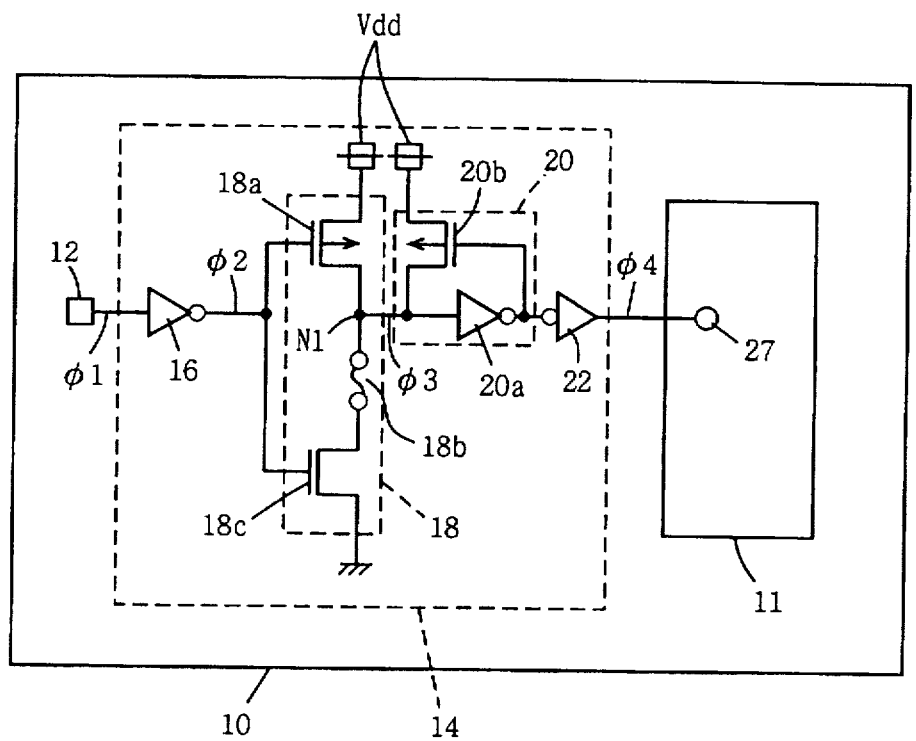
FIG. 1 shows an example of a structure of a pass/fail determination circuit of a conventional semiconductor integrated circuit device.
Figure 2:
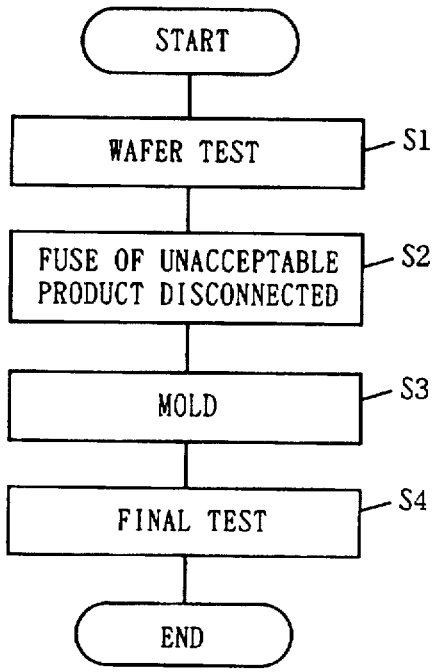
FIG. 2 is a flow chart of a pass/fail determination operation of a conventional semiconductor integrated circuit device.

FIG. 3 is a flow chart of a pass/fail determination method of a semiconductor integrated circuit device according to the present invention. A method of pass/fail determination of a semiconductor integrated circuit device according to the present invention will now be described with reference to FIG. 3.

At the wafer level where a plurality of semiconductor integrated circuit devices are formed on a wafer, a function test of each semiconductor integrated circuit device on the wafer is carried out (step S10). In the testing of the wafer level (wafer test), determination is made as to whether each semiconductor integrated circuit device is acceptable/ unacceptable according to the result of the function test (step S12). When determination is made that the semiconductor integrated circuit device is not an acceptable product at step S12, then determination is made as to whether that fault is repairable or not (step S14). This determination is carried out by, for example, determining whether the faulty circuit can be substituted with a redundant circuit. An example of such a redundant circuit is a redundant memory cell provided for memory cells in a semiconductor memory device.

A semiconductor integrated circuit device determined to be unrepairable in step S14 is identified as an unacceptable product (step S15). The semiconductor integrated circuit device identified as an unacceptable product is registered in a tester not shown. As an example of this identification of an unacceptable product, there is a case where the number of memory cells identified as being faulty is greater than the number of the prepared redundant memory cells.

The fuse element in a pass/fail confirmation circuit that will be described afterwards is blown off (step S16) for a semiconductor integrated circuit device determined to be an acceptable product at step S12 and for a semiconductor integrated circuit device determined to be to be repairable at step S14. At step S16, in a semiconductor integrated circuit device determined to be repairable, the fuse element for failure repair is blown off (programmed). Substitution, if necessary, with a redundant circuit is also carried out at this step S16. Also, a fuse element for improving characteristics is also blown off. The program of a fuse element for characteristic improvement includes a program for adjustment of the level of the reference voltage of an internally provided reference voltage generation circuit, a program for adjustment (trimming) of the level of an internal power supply voltage (trimming) generated by an internal voltage-down converting circuit that generates an internal operating power supply voltage from an external power supply voltage. Upon completion of the fuse program step, a dicing step (step S18) for separating the semiconductor integrated circuit devices formed on a wafer (into chips) is carried out.

Each semiconductor integrated circuit device is separated into an individual chip by this dicing step. Then, determination is made of whether each individual semiconductor integrated circuit device is acceptable/unacceptable (step S20). This determination is first carried out by selecting a semiconductor integrated circuit device (chip) identified as a defective product at step S15 and registered in the tester. For the purpose of facilitating selection of a defective product, a visible mark can be made on the defective product during the step common to the laser emitting step for fuse programming at step S16.

All the semiconductor integrated circuit devices excluding the semiconductor integrated circuit device (chip) determined to be an unacceptable product at step S20 is mounted in each package (molded) (step S22). Thus, a semiconductor integrated circuit device as a discrete component is completed. The semiconductor integrated circuit device selected as being a defective product at step S20 is discarded (step S23).

Final testing is carried out on the semiconductor integrated circuit device subjected to the mold step of S22 (step S24). At this final test step S24, signals are input/output via the external terminal of all the molded semiconductor integrated circuit devices. Function testing according to a predetermined test pattern is carried out for pass/fail determination.

At this final test step S24, a fuse blow test is carried out to determine whether a predetermined fuse element is reliably cut off using a pass/fail confirmation circuit, as will be described afterwards. When determination is made that the fuse element included in the pass/fail confirmation circuit is cut off, determination is made that the programming of other fuse elements is similarly carried out properly. When determination is made that cut off of a fuse element is not carried out completely in the fuse blow test in final test step S24, determination is made that cut off of the fuse element in the internal fuse-programmable circuit is also incomplete. Therefore, determination of whether the defect, when detected, is caused by cut off failure of a fuse element or not can be made in failure analysis.

The final test is carried out on all the mold semiconductor integrated circuit devices. Since only acceptable products detected at the wafer level are selected and molded according to the fail selection step of S20, it is not necessary to carry out pass/fail determination prior to carrying out final testing. Therefore, the time required for testing is shortened.

Figure 4A:
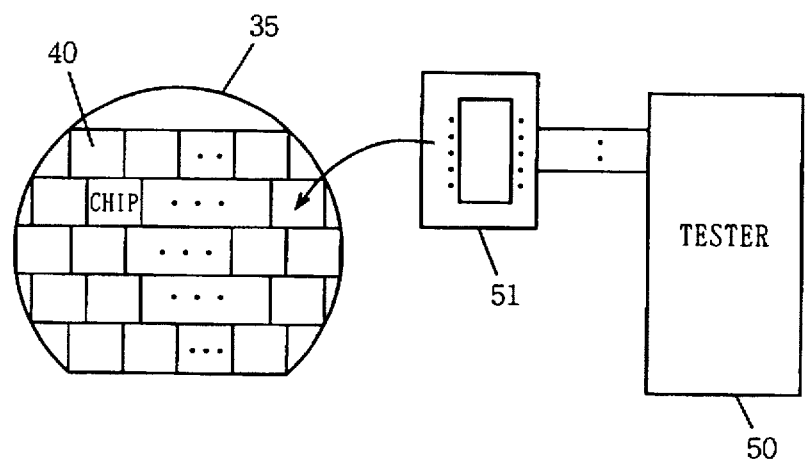
FIGS. 4A–4C schematically show the test environment in a test operation of a semiconductor integrated circuit device of the present invention.

FIG. 4A schematically shows the environment in which testing at the wafer level is carried out. A plurality of chips 40 are formed on a wafer 35. A semiconductor integrated circuit device is formed on chip 40. Following formation of a semiconductor integrated circuit device in chip 40, function testing is carried out by applying a test signal simultaneously to a predetermined number of chips using a jig 51 under control of a tester 50 in which a predetermined test program is stored. FIG. 51 has an empty internal portion. By forming contact with chip 40 at that empty portion, a test signal provided from tester 50 is applied to a pad formed at chip 40.

Figure 4B:
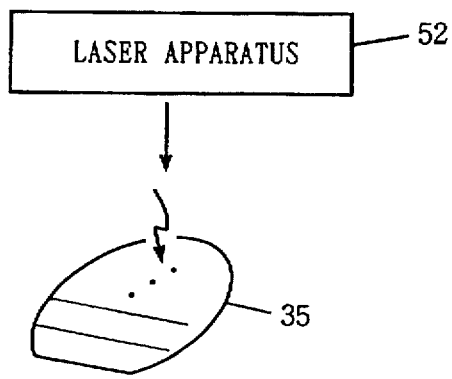

FIG. 4B schematically shows the environment for carrying out a laser radiation step for blowing off a fuse element. As shown in FIG. 4B, following the pass/fail determination of the semiconductor integrated circuit device formed at each chip on wafer 35, a laser beam is directed to a semiconductor integrated circuit device identified as an acceptable product or as a repairable product. The fuses in the pass/fail confirmation circuit and in the internal fuse-programmable circuit are blown off. Programming of a pass/fail state and a redundant circuit or trimming for characteristic improvement are carried out.

Figure 4C:
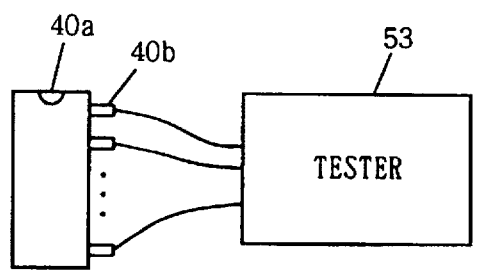

FIG. 4C schematically shows the environment for carrying out testing of a semiconductor integrated circuit device at the individual chip level (final test). The unit semiconductor integrated circuit device 40a is molded to be formed as a discrete component. In this case, a test signal from a tester 53 in which a predetermined test program is stored is applied according to a predetermined sequence to a terminal 40b that is led out externally, in order to execute function testing of semiconductor integrated circuit device 40a. A plurality of semiconductor integrated circuit devices 40a are tested simultaneously (for shortening the test time) at the final test of the chip unit level.

Figure 5:
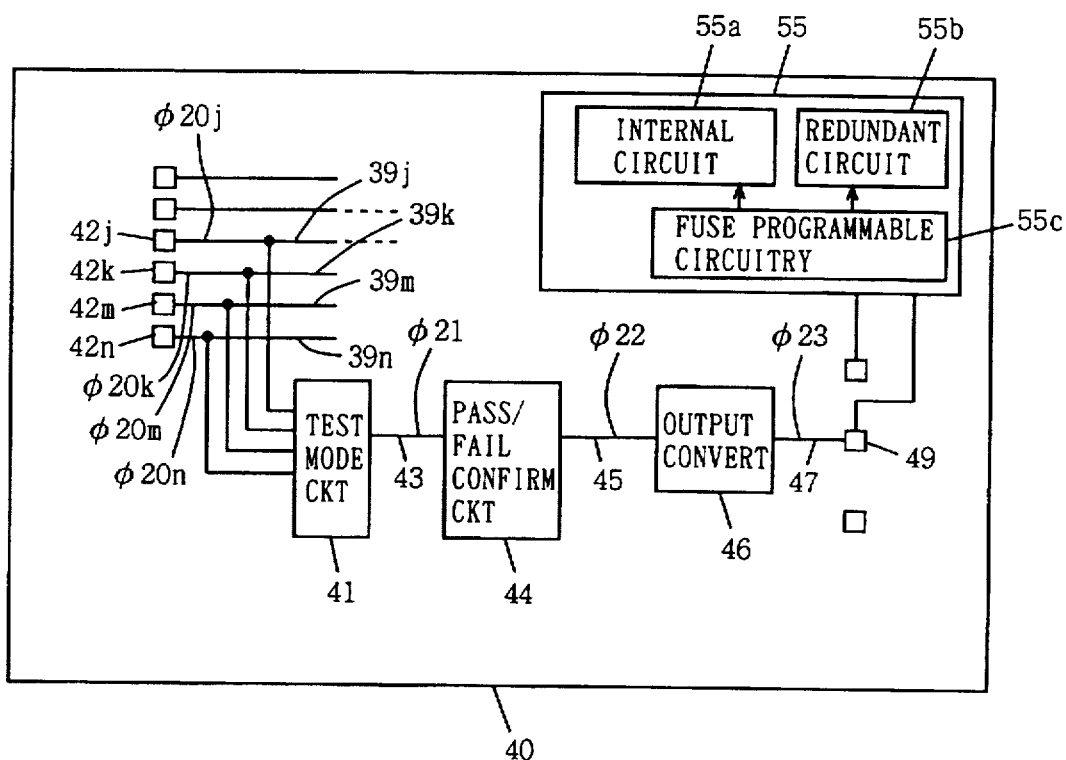
FIG. 5 schematically shows a structure of a main part of a semiconductor integrated circuit device according to the present invention.

FIG. 5 is a block diagram schematically showing a structure of main components of a semiconductor integrated circuit device according to the present invention. Referring to FIG. 5, a semiconductor integrated circuit device (chip) 40 includes a test mode circuit 41 for determining whether a fuse blow test mode is specified or not to provide a signal $\phi 21$ indicating this result onto a signal line 43, according to signals $\phi 20j$, $\phi 20k$, $\phi 20m$ and $\phi 20n$ applied onto signal lines 39$j$, 39$k$, 39$m$ and 39$n$ via signal input terminals (pad) 42$j$, 42$l$, 42$m$ and 42$n$, a pass/fail confirmation circuit 44 activated in response to signal $\phi 21$ from test mode circuit 41 to provide a signal of a logic according to conduction/nonconduction of an internally included fuse element onto a signal line 45, and an output conversion circuit 46 for converting signal $\phi 21$ provided on signal line 45 from pass/fail confirmation circuit 44 into a signal $\phi 23$ of an externally observable form and providing the converted signal to an output terminal (pad) 49 via a signal line 47.

Semiconductor integrated circuit device 40 further includes a function block 55 that operates according to signals $\phi 20k$–$\phi 20n$ from input terminals 42$j$–42$n$ and a signal not shown. Function block 55 includes an internal circuit 55$a$ for executing a predetermined function during activation thereof, a redundant circuit 55$b$ for carrying out substitution of a faulty circuit in internal circuit 55$a$, and a fuse-programmable circuit 55$c$ including a fuse element for improving the characteristics of internal circuit 55$a$ and for activating redundant circuit 55$b$. Function block 55 is electrically connected to an output terminal (pad) 49 and such to input/output a signal/voltage in a normal operation mode. The operation of semiconductor integrated circuit device 40 of FIG. 5 will now be briefly described.

Test mode circuit 41 determines whether a fuse blow test mode is specified or not according to signals $\phi 20j$–$\phi 20n$ from input terminals 42$j$–42$n$ to render active/inactive signal $\phi 21$ according to the result of determination. This fuse blow test mode is an operation mode for determining cut off/non-cut off of a fuse element included in pass/fail confirmation circuit 44. This fuse blow test mode may be an operation mode for detecting fuse cut off failure in failure analysis, or an operation mode for first determining pass/fail of the semiconductor integrated circuit device during the function testing at the individual chip level (for reconfirmation of acceptable/unacceptable product determined at wafer level). The specific structure of test mode circuit 41 will be described in detail afterwards. Determination is made that a fuse blow test mode is specified when signals $\phi 20j$–$\phi 20n$ are set to states of a predetermined combination.

Pass/fail confirmation circuit 44 includes a fuse element. Fuse element is blown off only for a semiconductor integrated circuit device that is determined to be an acceptable product at the wafer level test. Pass/fail confirmation circuit 44 has the pass/fail state of the corresponding semiconductor integrated circuit device stored according to conduction/non-conduction of this fuse element. In response to activation of signal $\phi 21$ applied from test mode circuit 41 via signal line 43, pass/fail confirmation circuit 44 provides signal $\phi 22$ of a logic value according to conduction/non-conduction of the fuse element. By detecting the logic value of signal $\phi 22$ at the outside world, conduction/non-conduction of a fuse element in pass/fail confirmation circuit 44 can be externally determined.

Output signal $\phi 22$ of pass/fail confirmation circuit 44 is normally not provided to an external terminal. This is because external terminal (pad) 49 is used to input or output a signal voltage to or from function block 55 in a normal operation mode (in an operation mode other than a fuse blow test mode). Therefore, in the fuse blow test mode, output conversion circuit 46 converts signal φ22 from pass/fail confirmation circuit 44 into signal φ23, which is provided to external terminal 49. Signal φ23 is a signal that can be externally observed. Determination of conduction/non-conduction of the fuse in the semiconductor integrated circuit device can be made by observing signal φ23.

In a semiconductor integrated circuit device according to the present invention, a fuse element included in pass/fail confirmation circuit 44 of a semiconductor integrated circuit device determined to be an acceptable product at wafer test step S10 shown in FIG. 3 is blown off. Any semiconductor integrated circuit device determined to be an unacceptable product at wafer test step S10 is discarded in advance at the defective product discard step S23 shown in FIG. 23. Therefore, at final test step S24 at the chip unit level, only the semiconductor integrated circuit device determined to be an acceptable product at the wafer level is tested. By carrying out a fuse blow test mode in the failure analysis when many defects are found in final test step S24, identification of whether the fuse element in pass/fail confirmation circuit 44 is cut off or not can be made externally.

More specifically, when the logic of output signal φ22 of pass/fail confirmation circuit 44 differs from a predetermined logic value, determination can be made that the fuse element included in pass/fail confirmation circuit 44 is not cut off. Therefore, determination can be made that the failure is caused by cut off failure in the internal fuse element in the failure analysis.

In contrast, by first executing this fuse blow test at final test step S24, determination can be made of conduction/non-conduction of the fuse element included in pass/fail confirmation circuit 44. When determination is made that the fuse element is not blown off, determination can be made that cut off of the fuse element included in fuse-programmable circuit 55c of FIG. 5 is incomplete. Therefore, this semiconductor integrated circuit device can be determined to be an unacceptable product. It is not necessary to carry out subsequent testing on this device. Thus, the semiconductor integrated circuit device identified as having a defect caused by a fuse element as a result of detecting the logic of output signal φ22 of pass/fail confirmation circuit 44 at final test step S24 is not subjected to subsequent testing. Testing is carried out only for the semiconductor integrated circuit device in which the fuse element is completely cut off, i.e. in which proper programming (or trimming) of the fuse element is carried out in a normal fuse programmable circuit 55c. Thus, testing of a semiconductor integrated circuit device that has the failure cause can be omitted. Furthermore, in this state, the fault of a semiconductor integrated circuit device determined to be an unacceptable product in the fuse blow test mode of final test step S24 can easily be identified to be caused by the cut off failure of the fuse element.

A fuse blow test mode is set according to a combination of the states of signals φ20a–φ20n appearing on signal lines 39j–39n via input terminals 42j–42n used in a normal operation mode. It is not necessary to provide a further external terminal for the purpose of fuse blow test mode specification. Signal φ23 indicating the test result of the fuse blow test mode is output via an external terminal (pad) 49 used in a normal operation mode via signal line 47 from output conversion circuit 46. An extra external terminal for providing the signal indicating the fuse blow test result is not required. Therefore, conduction/non-conduction of a fuse element in a semiconductor integrated circuit device can easily be determined externally using an input/output terminal provided according to a predetermined standard.

Figure 6:
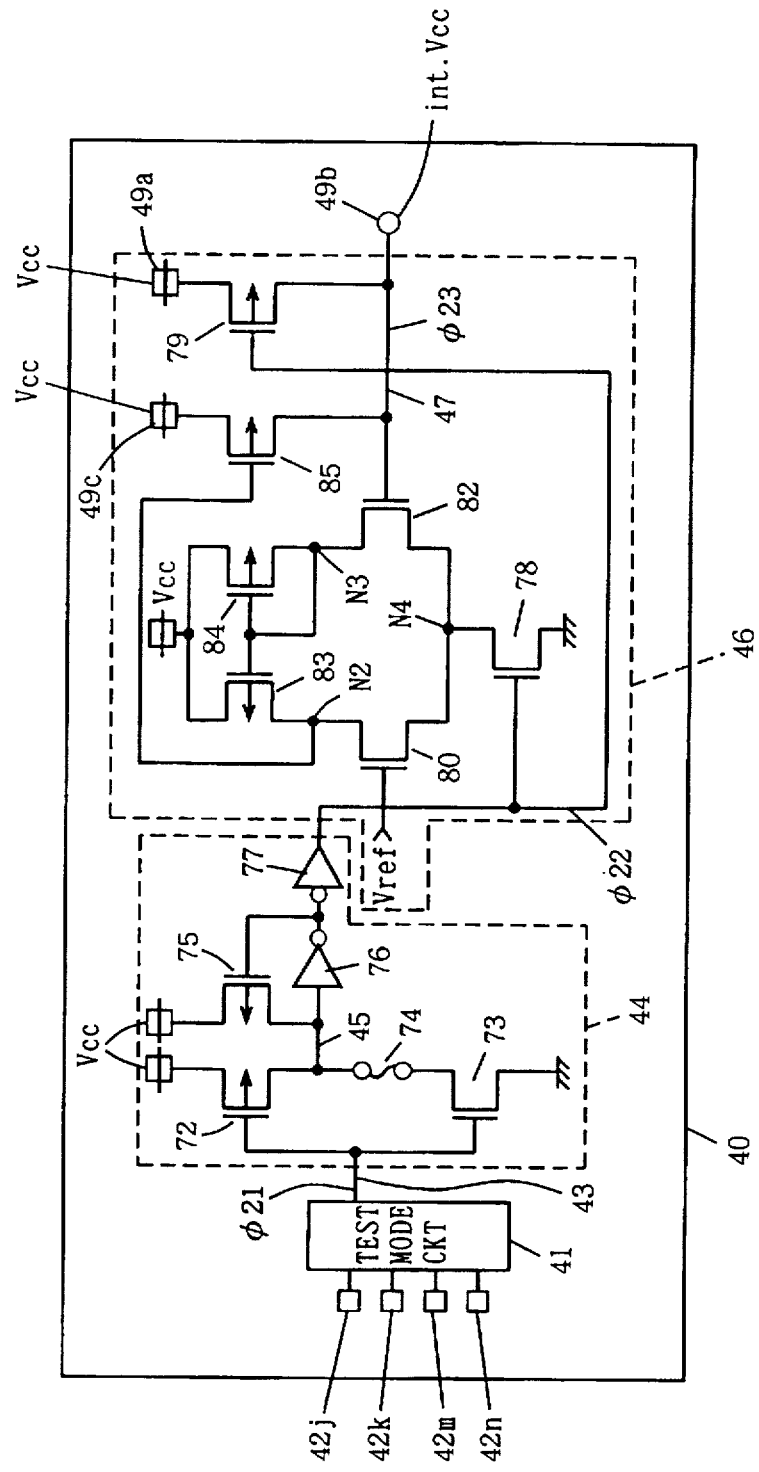
FIG. 6 shows an example of a structure of a pass/fail determination unit of a semiconductor integrated circuit device according to the present invention.

FIG. 6 shows a specific example of pass/fail confirmation circuit 44 and output conversion circuit 46 of FIG. 5. Referring to FIG. 6, pass/fail confirmation circuit 44 includes a p channel MOS transistor 72 connected between a power supply node to which an external power supply voltage Vcc is supplied and signal line 45 for receiving output signal φ21 from test mode circuit 41 at its gate, a fuse element 74 connected to signal line 45, an n channel MOS transistor 73 connected between fuse element 74 and a ground node and receiving signal φ21 from test mode circuit 41 at its gate via signal line 43, an inverter circuit 76 receiving a signal on signal line 45, an inverter circuit 77 for inverting an output signal of inverter circuit 76 to output signal φ22, and a p channel MOS transistor 75 connected between the node to which external power supply voltage Vcc is supplied and signal line 45 and receiving an output signal of inverter circuit 76 at its gate. MOS transistor 75 and inverter circuit 76 form a latch circuit.

When determination is made of an acceptable product during the wafer level test step, fuse element 74 in pass/fail confirmation circuit 44 is blown off (cut off) using a high energy ray such as a laser beam. When determination is made that the semiconductor integrated circuit device is an unacceptable product at the wafer level test, blowing off of fuse element 74 is not carried out. When fuse element 74 is blown off, the potential on signal line 45 is maintained at an H level (logical high) of the external power supply voltage Vcc level by inverter circuit 76 and MOS transistor 75. When fuse element 74 is in a conductive state, MOS transistors 72 and 73 operate as a CMOS inverter circuit to provide a signal onto signal line 45 according to output signal φ21 from test mode circuit 41. Therefore, when output signal φ21 of test mode circuit 41 is set to an H level in the fuse blow test mode, output signal φ22 from pass/fail confirmation circuit 44 is driven to an L level (logical low) if fuse element 74 is in a conductive state. If fuse element 74 is in a cut off state, signal φ22 is constantly maintained at an H level. Therefore, semiconductor integrated circuit device can be identified as an acceptable product or an unacceptable product by detecting the logic level (potential level) of signal φ22.

Signal φ22 is an internal signal of semiconductor integrated circuit device 40, and is not provided to the outside world. Output conversion circuit 46 is provided to allow observation of signal φ22 from the outside world.

Output conversion circuit 46 includes a p channel MOS transistor 83 connected between the node receiving external power supply voltage Vcc and an internal node N2, and has its gate connected to an internal node N3, a p channel MOS transistor 84 connected between the node receiving external power supply voltage Vcc and internal node N3 and having a gate connected to internal node N3, an n channel MOS transistor 80 connected between internal node N2 and an internal node N4 and receiving a reference voltage Vref at its gate, an n channel MOS transistor 82 connected between internal nodes N3 and N4 and having a gate connected to signal line 47, an n channel MOS transistor 78 connected between internal node N4 and the ground node and receiving signal φ22 at its gate, a p channel MOS transistor 79 connected between a node 49a receiving external power supply voltage Vcc and signal line 47 and receiving signal φ22 at its gate, and a p channel MOS transistor 85 connected between external power supply node 49c and signal line 47 and having its gate connected to internal node N2.

External power supply nodes 49a and 49c may be respectively connected to different external power supply terminals, or to the same power supply terminal. Signal line 47 is connected to internal node 49b. Internal power supply voltage Int.Vcc is generated on internal node 49b to be applied as one operating power supply voltage of function block 55 of FIG. 5. Node 49b is an internal node that cannot be viewed from the outside world (after packaging). Output conversion circuit 46 is substantially an internal power supply voltage-down converting circuit for down-converting external power supply voltage Vcc and providing internal power supply voltage Int.Vcc in activation thereof. The operation will now be described briefly.

MOS transistors 80 and 82 form a comparator stage for comparing reference voltage Vref with signal φ23 (internal power supply voltage Int.Vcc) on signal line 47. MOS transistors 83 and 80 form a current mirror circuit. MOS transistor 78 functions as a current source. These MOS transistors 78, 80, 82, 83 and 84 form a differential amplifier circuit.

When MOS transistor 78 is non-conductive, the current path between the node receiving external power supply voltage Vcc and the ground node is shut off in this differential amplifier circuit. Therefore, the differential amplifier circuit attains an inactive state. In this state, the voltage of internal node N2 attains the level of external power supply voltage Vcc. In response, MOS transistor 85 attains a non-conductive state. Signal φ23 (internal power supply voltage Int.Vcc) attains the level of external power supply voltage Vcc since MOS transistor 79 conducts.

When MOS transistor 48 attains a conductive state, the differential amplifier circuit is activated. Comparison and amplification of reference voltage Vref and signal φ23 (internal power supply voltage Int.Vcc) on signal line 47 are carried out. More specifically, when reference voltage Vref is higher than signal φ23 (referred to as internal power supply voltage Int.Vcc hereinafter) of signal line 47, the conductance of MOS transistor 80 becomes greater than that of MOS transistor 82, whereby MOS transistor 80 conducts a greater current flow. MOS transistors 83 and 84 form a current mirror circuit, so that a current of equal magnitude flows in MOS transistors 83 and 84 (the sizes thereof are identical). Therefore, MOS transistor 80 discharged all the current supplied via MOS transistor 83. The potential level of internal node N2 is lowered, and the conductance of MOS transistor 85 increases. Current is supplied from external power supply node 49c onto signal line 47 to raise the voltage level of internal power supply voltage Int.Vcc.

In contrast, when internal power supply voltage Int.Vcc is higher than reference voltage Vref, the conductance of MOS transistor 82 becomes greater than that of MOS transistor 80, whereby MOS transistor 82 conducts a greater current flow than MOS transistor 80. A current of a magnitude identical to that flowing in MOS transistor 82 is supplied to MOS transistor 80 by the current mirror circuit of MOS transistors 84 and 83. Therefore, the potential level of internal node N2 increases, whereby MOS transistor 85 is driven to a non-conductive state. Thus, internal power supply voltage Int.Vcc is substantially maintained at the voltage level of reference voltage Vref.

When the differential amplifier circuit formed of MOS transistors 78, 80, 82, 83 and 84 is active, signal φ23 attains an H level and MOS transistor 79 attains a non-conductive state.

The following operation is carried out in a fuse blow test mode. When fuse element 74 in pass/fail confirmation circuit 44 is blown off and the semiconductor integrated circuit device is indicated to be an acceptable product at the wafer test, output signal φ22 of pass/fail confirmation circuit 44 attains an H level. In contrast, when fuse element 74 is in the conductive state, output signal φ22 of pass/fail confirmation circuit 44 attains an L level.

When this semiconductor integrated circuit device is determined to be an acceptable product in the wafer level test, fuse element 74 is blown off. Signal φ22 is maintained at an H level, and the differential amplifier circuit (MOS transistors 78, 80, 82, 83 and 84) is activated. Internal power supply voltage Int.Vcc is maintained at the level of reference voltage Vref. In contrast, when this semiconductor integrated circuit device is determined to be to be an unacceptable product in the wafer level test, fuse element 74 is in a non-blown off state. Signal φ22 is set at an L level in a fuse blow test mode, and the differential amplifier circuit in output conversion circuit 46 is set at an inactive state. In this case, MOS transistor 85 receives a signal of the external power supply voltage Vcc level at its gate to attain a non-conductive state. MOS transistor 79 conducts according to signal φ22 of an L level to maintain internal power supply voltage Int.Vcc at the level of external power supply voltage Vcc. The voltage level of internal power supply voltage Int.Vcc corresponding to the pass/fail state of the semiconductor integrated circuit device is observed from the outside world. In this case, internal power supply node 49b is an internal node and direct contact thereto cannot be provided from the outside world. Therefore, a test arrangement as shown in FIG. 7 is employed.

Figure 7:
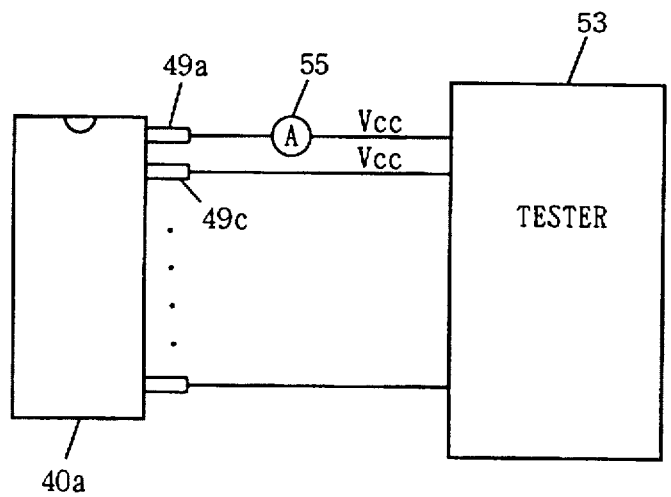
FIG. 7 schematically shows the test environment of a semiconductor integrated circuit device according to the present invention.

FIG. 7 specifically shows the test environment of a fuse blow test mode of a semiconductor integrated circuit device of FIG. 6. In FIG. 7, terminals (pad) 49a and 49c are connected to different external pin terminals. A test pattern is provided from tester 53 to semiconductor integrated circuit device 40a at a predetermined sequence. Power supply voltage Vcc from tester 53 is applied to power supply terminal 49a of semiconductor integrated circuit device 40a. In the application path of power supply voltage Vcc, a current meter (ampere meter) 55 is disposed for external terminal 49a. When this semiconductor integrated circuit device is an acceptable product, MOS transistor 79 of FIG. 6 is in a non-conductive state and no current flows (excluding small leakage current). When this semiconductor integrated circuit device is an unacceptable product, MOS transistor 79 of FIG. 6 conducts, whereby leakage current flows from power supply terminal 49a towards the internal function block via internal power supply node 49b shown in FIG. 6. A relatively great leakage current flows even when this semiconductor integrated circuit device attains a standby state. Therefore, by detecting the level of this leakage current with current meter 55, identification can easily be made of whether fuse element 74 in pass/fail confirmation circuit 44 included in semiconductor integrated circuit device 40a is cut off or not.

In the arrangement of FIG. 7, power supply terminals 49a and 49c are illustrated as to be provided individually. However, if the current driving capability of MOS transistor 79 in the structure shown in FIG. 6 is sufficiently lower than that of MOS transistor 85, the leakage current is correspondingly reduced. Even if external power supply terminals 49a and 49c are the same terminal, conduction/non-conduction of the fuse element in the semiconductor integrated circuit device can be identified by observing the level of the leakage current using an external current meter 55 in a similar manner.

Furthermore, in the case where power supply terminals 49a and 49c are provided individually and separatedly, the voltage from power supply terminal 49a may be used by another circuit (a circuit in the function block).

When power supply terminals 49a and 49c are the same power supply terminal, internal power supply voltage Int.Vcc attains the level of reference voltage Vref, which is lower than external power supply voltage Vcc when the semiconductor integrated circuit device is an acceptable product. Leakage current flows via MOS transistor 85, and a relatively great current flows via MOS transistor 78. In this acceptable product, MOS transistor 79 has a gate potential of the level of external power supply voltage Vcc, attaining a non-conductive state. Only a leakage current of a level that can be neglected in comparison to the leakage current of MOS transistor 85 is generated.

In contrast, when the semiconductor integrated circuit device is an unacceptable product, internal power supply voltage Int.Vcc attains the level of external power supply voltage Vcc. The source and drain voltages of MOS transistors 85 and 79 both become equal. Almost no leakage current of MOS transistors 79 and 85 is generated. Only a small leakage current is generated in MOS transistor 85. Therefore, even when power supply terminals 49a and 49c are connected to the same external power supply terminal, identification of whether fuse element 74 in pass/fail confirmation circuit 44 in the semiconductor integrated circuit device is cut off or not can be made by observing the level of the leakage current of the power supply terminal using a current meter.

Although internal power supply voltage-down converting circuit 46 is used as output conversion circuit 46, this internal power supply voltage-down converting circuit is activated/inactivated according to output signal φ22 of pass/fail confirmation circuit 44. Therefore, when the signal varying according to internal power supply voltage Int.Vcc is output via another output terminal, the change in the voltage level of the signal at that output terminal can be detected. Determination of conduction/non-conduction of fuse element 70 in pass/fail confirmation circuit 44 can be made by monitoring the current at a power supply terminal using a current meter, or by receiving the voltage of the terminal from which the signal of an internal power supply voltage level is output.

By observing the value of the power supply current at power supply terminal 49a using an external current meter, the conduction/non-conduction state of a fuse element blown off according to the result of the wafer level test can be determined by examining of the current/voltage level of a predetermined external terminal in the final test step. It is not necessary to melt the mold resin for packaging or destroy the package to carry out microscopic observation.

Since pass/fail confirmation circuit 44 is not provided at a signal propagation path between a signal input terminal and an internal function block circuit, and provided at a different signal path, the internal operation of semiconductor integrated circuit device 40 is not adversely affected during any operation period other than the fuse blow test mode. Furthermore, since conduction/non-conduction of the fuse element of the pass/fail confirmation circuit is determined using an external power supply terminal, it is not necessary to add any extra pin terminal. Compatibility of the pin arrangement with the industry standard can be maintained.

FIG. 8 shows an example of a structure of test mode circuit 41 of FIG. 6. In the structure of the test mode circuit 41 shown in FIG. 8, a dynamic random access memory (DRAM) is employed as a semiconductor integrated circuit device.

Referring to FIG. 8, test mode circuit 41 includes cascaded inverter circuits 101, 102 and 103 of three stages receiving a row address strobe signal ZRAS applied to an input terminal (pad) 42j, a tristate inverter buffer 104 activated when output signal φ20g of inverter circuit 103 is activated (L level) to invert and output column address strobe signal ZCAS (signal φ20b) applied to input terminal (pad) 42k, an inverter circuit 105 for inverting an output signal of tristate inverter buffer 104, a tristate inverter buffer 106 activated, when output signal φ20f of inverter circuit 102 is activated (L level), to invert the output signal of inverter circuit 105 and transmit the inverted signal to the input portion of inverter circuit 105, a tristate inverter buffer 107 activated, when output signal φ20g of inverter circuit 103 is activated, to invert and output a write enable signal ZWE (signal φ20c) applied to an input terminal (pad) 42m, an inverter circuit 108 for inverting the output signal of tristate inverter buffer 107, and a tristate inverter buffer 109 activated, when output signal φ20f of inverter circuit 102 is activated, to invert the output signal of inverter circuit 108 and transmit the inverted signal to the input portion of inverter circuit 108.

Tristate inverter buffers 104, 106, 107 and 109 attain an output high impedance state during inactivation thereof. Tristate inverter buffers 106 and 109 function as a inverter when activated to form a latch circuit respectively with inverter circuits 105 and 108.

Test mode circuit 41 further includes an inverter circuit 110 for receiving row address strobe signal ZRAS (signal φ20a) applied via input terminal 42j, an inverter circuit 111 receiving output signal φ20h of inverter circuit 108, a 2-input NAND circuit 112 for receiving output signal φ20j of inverter circuit 110 and output signal φ20k of inverter circuit 111, a 2-input NOR circuit 113 for receiving an output signal of NAND circuit 112 and a signal applied from inverter circuit 105 via signal line 41, an inverter circuit 114 for receiving an output signal of NOR circuit 113, and an inverter circuit 115 for receiving an output signal of inverter circuit 114 and providing signal φ20m. These circuit portions form a WCBR detection circuit that drives signal φ20m to an H level when the so-called WCBR (WE, CAS before RAS) condition is satisfied. The operation thereof will be described in details afterwards.

Test mode circuit 41 further includes a VIH detection circuit 116 for detecting whether an address signal bit An applied to input terminal 42n attains a level of at least a predetermined voltage, a 2-input NAND circuit 117 for receiving an output signal of VIH detection circuit 116 and signal φ20m, an inverter circuit 118 for receiving an output signal of NAND circuit 117, and a latch circuit 119 for latching an output signal of inverter circuit 118. Signal φ21 is output from latch circuit 119.

Address signal bit An applied to input terminal 42n is also applied to an input buffer 120 to become an internal address signal bit intAn. Although signal An is described as an address signal bit, it may be write data, for example. VIH detection circuit 116 determines whether signal An applied to input terminal 42n is set to a voltage level higher than the power supply voltage level of a normal operation. Therefore, test mode circuit 41 has signal φ21 driven to an H level of an active state when the so-called super Vcc+WCBR condition is satisfied.

Row address strobe signal ZRAS is a signal defining an operation cycle (standby cycle and active cycle) of a semiconductor device. An active cycle commences to initiate a select operation of a memory cell when this row address strobe signal ZRAS attains an active state of an L level. Column address strobe signal ZCAS provides the timing for incorporating a column address. When column address strobe signal ZCAS attains an active state of an L level, a column select operation of the memory cell is internally initiated in the semiconductor integrated circuit device. Write enable signal ZWE is a write mode designating signal instructing data writing. When signals ZCAS and ZWE both attain an active state of an L level, data is written internally to a selected memory cell. The operation of the test mode circuit of FIG. 8 will now be described with reference to the timing charts of FIGS. 9A–9E.

When row address strobe signal ZRAS attains an H level in a period T1 prior to time t1, column address strobe signal ZCAS and write enable signal ZWE are both set at an L level, and address signal bit An is set at a voltage level higher than the power supply voltage level of a normal operation. When row address strobe signal ZRAS attains an H level, signal $\phi 20a$ attains an H level, whereby signal $\phi 20f$ attains an H level and signal $\phi 20g$ attains an L level. Therefore, tristate inverter buffers 104 and 107 are made active and tristate inverter buffers 106 and 109 are made inactive. Tristate inverter buffers 104 and 107 invert internal signal $\phi 20b$ corresponding to column address strobe signal ZCAS and internal signal $\phi 20c$ corresponding to write enable signal ZWE, to transmit the inverted signals to inverter circuits 105 and 108, respectively.

Since row address strobe signal ZRAS is at an H level, output signal $\phi 20j$ of inverter circuit 110 attains an L level. The output signal of NAND circuit 112 is driven to an H level. Signal $\phi 20m$ output via NOR circuit 113 and inverter circuits 114 and 115 maintains an L level. Therefore, signal $\phi 21$ output via NAND circuit 117, inverter circuit 118 and latch 119 maintains an L level.

When row address strobe signal ZRAS is pulled down to an L level at time t1, internal signals $\phi 20g$ and $\phi 20f$ attain an H level and an L level, respectively. Tristate inverter buffers 104 and 107 become inactive to attain an output high impedance state. In contrast, tristate inverter buffers 106 and 109 are activated. The signals applied before time t1 are latched by inverters 105 and 109. Also, signal $\phi 20c$ applied before time t1 is latched by inverter circuits 108 and 109.

Address signal bit An is set to a voltage level higher than the power supply voltage of a normal operation mode. The output signal of VIH detection circuit 116 attains an H level. When row address strobe signal ZRAS is pulled down to an L level, internal signal $\phi 20a$ is driven to an L level, and output signal $\phi 20g$ of inverter circuit 110 is driven to an H level. Output signal $\phi 20h$ of inverter circuit 108 attains an L level and output signal $\phi 20k$ of inverter circuit 111 attains an H level. Therefore, the output signal of NAND circuit 112 is pulled down to an L level. Also, the output signal of inverter circuit 105 attains an L level, and the output signal of NOR circuit 113 is driven to an H level. In response, signal $\phi 20m$ is pulled up to an H level via inverter circuits 114 and 115.

When signal $\phi 20m$ is driven to an H level, NAND circuit 117 receives signals of H levels at both input thereof and the output signal thereof attains an L level, and the output signal of inverter circuit 118 attains an L level. Signal $\phi 21$ from latch 119 is pulled up to an H level. There is a delay time in each circuit before signal $\phi 21$ rises at time t2. This period T2 from time t1 to time t2 is a test mode entry period. When signal $\phi 21$ attains an H level, the determination operation of the logic of the output signal of pass/fail confirmation circuit 44 shown in FIG. 46 can be effected. Period T3 following time t2 is the test mode period.

When a predetermined test is completed, row address strobe signal ZRAS rises to an H level. Output signal $\phi 20j$ of inverter circuit 110 is driven to an L level, and the output signal of NAND circuit 112 is driven to an H level. In response, the output signal of NOR circuit 113 is pulled down to an L level, and signal $\phi 20m$ applied via inverter circuits 114 and 115 attains an L level. In response, the output signal of NAND circuit 117 is pulled up to an H level. When latch 119 is formed of, for example, an inverter latch, signal $\phi 21$ is reset to an L level in response to the rise of row address strobe signal ZRAS. If latch 119 is formed of a flip-flop, signal $\phi 21$ maintains an active state of an H level even if row address strobe signal ZRAS is pulled up to an H level and the remaining signals ZCAS, ZWE and An return to the initial state (H level). When such a flip-flop is used, signal $\phi 21$ is reset using row address strobe signal ZRAS and column address strobe signal ZCAS with a CBR (CAS before RAS) condition. By setting/resetting the test mode using a combination of the states of a plurality of external signals, the test mode can be properly set/reset without being affected by noise and the like.

Figure 10:
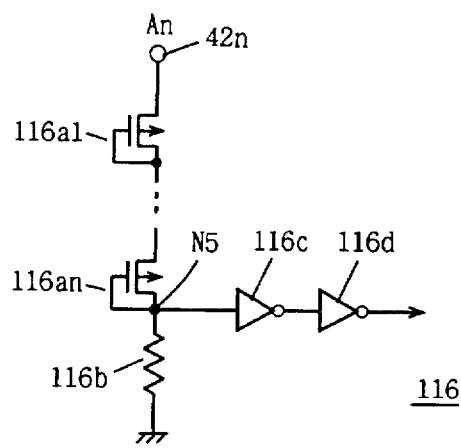
FIG. 10 shows an example of a structure of a VIH detection circuit of FIG. 8.

FIG. 10 shows an example of a structure of VIH detection circuit 116 of FIG. 8. Referring to FIG. 10, VIH detection circuit 116 includes resistor-connected p channel MOS transistors 116a1–116an connected in series between an input terminal (pad) 42n and an internal node N5, a resistor 116b of high resistance connected between internal node N5 and the ground node, an inverter circuit 116c for inverting a signal on internal node N5, and an inverter circuit 116d for inverting an output signal of inverter circuit 116c. An output signal of VIH detection circuit 116 is output from inverter circuit 116d to be applied to one input of NAND circuit 117 (refer to FIG. 8).

MOS transistors 116a1–116an each have an absolute value VTH of the respective threshold voltage. Each channel resistance is set sufficiently lower than that of resistor 116b. When the voltage level of signal An applied to input terminal 42n is lower than n·VTH, at least one of MOS transistors 116a1–116an attains a non-conductive state, so that current does not flow from internal node 42n to internal node N5. In this state, internal node N5 is maintained at an L level by resistor 116b. When the voltage level of signal An applied to input terminal 42n becomes higher than n·VTH, all MOS transistors 116a1–116an conduct, so that current flows from internal terminal 42n to the ground node. Although MOS transistor 116a1–116an each operate in a resistance mode, each channel resistance is set sufficiently smaller than the resistance value of resistor 116b. Therefore, the potential of internal node N5 rises to an H level according to the value of the current flowing through resistor 116b, and the output signal from inverter circuit 116d is pulled up to an H level. Thus, detection can be made that signal An is set higher than the voltage level of a normal operation mode. An appropriate number of MOS transistors 116a1–116an is provided according to the voltage level to be detected.

Figure 11:
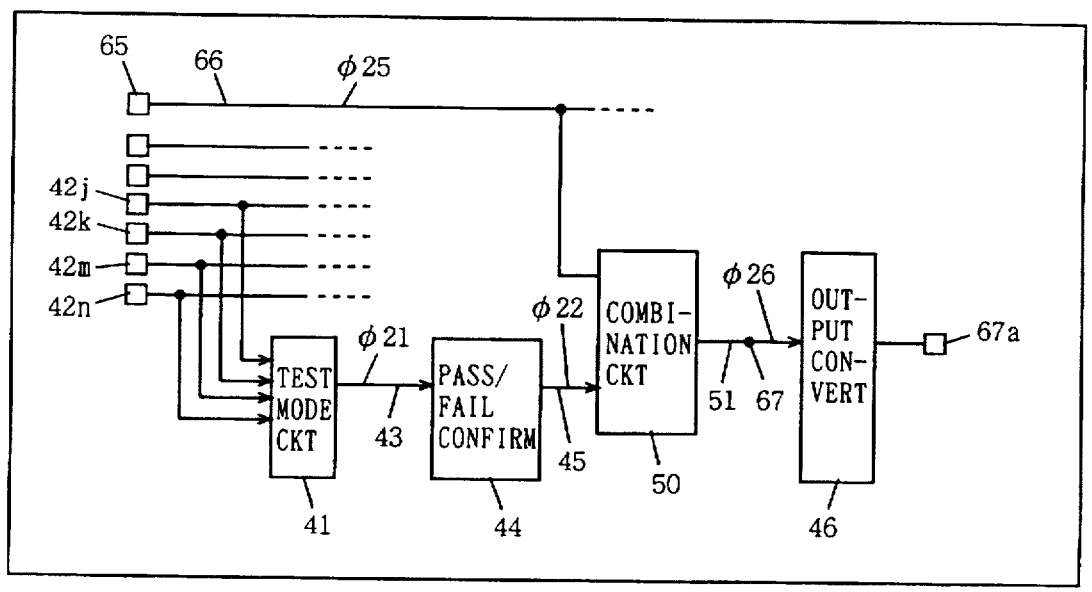
FIG. 11 schematically shows a structure of a first modification of a semiconductor integrated circuit device according to the present invention.

FIG. 11 shows a structure of a modification of a semiconductor integrated circuit device according to the present invention. In the structure of a semiconductor integrated circuit device 40 of FIG. 11, a combine (combination) circuit 50 is provided between pass/fail confirmation circuit 44 and output conversion circuit 46. Combination circuit 50 combines a signal $\phi 25$ applied from an input terminal 65 via a signal line 66 and a signal $\phi 22$ provided onto a signal line 45 from pass/fail confirmation circuit 44 to provide the combined signal onto a signal line 51 as a signal $\phi 26$. The remaining structure is similar to that shown in FIGS. 6 and 5. Corresponding components have the same reference characters allotted, and their description will not be repeated.

Combination circuit 50 selects either signal $\phi 25$ applied from an input terminal (pad) 65 via a signal line 66 or signal φ22 from signal line 45 according to output signal φ22 from pass/fail confirmation circuit 44, to convert the selected signal into a signal corresponding to one logic level and provide the converted signal as signal φ26. Signal φ26 applied from combination circuit 50 via signal line 51 is converted into a signal form that is extenally observable and then output to external terminal 67a by output conversion circuit 46. The structure of output conversion circuit 46 is similar to that shown in FIG. 6. Output signal φ22 from pass/fail confirmation circuit 44 and signal φ25 applied to a particular input terminal are combined. Signal φ26 is generated according to the combined result to be applied to output conversion circuit 46. It is therefore possible to reliably identify at which voltage level output signal φ22 of pass/fail confirmation circuit 44 is set in a fuse blow test mode.

Figure 12:
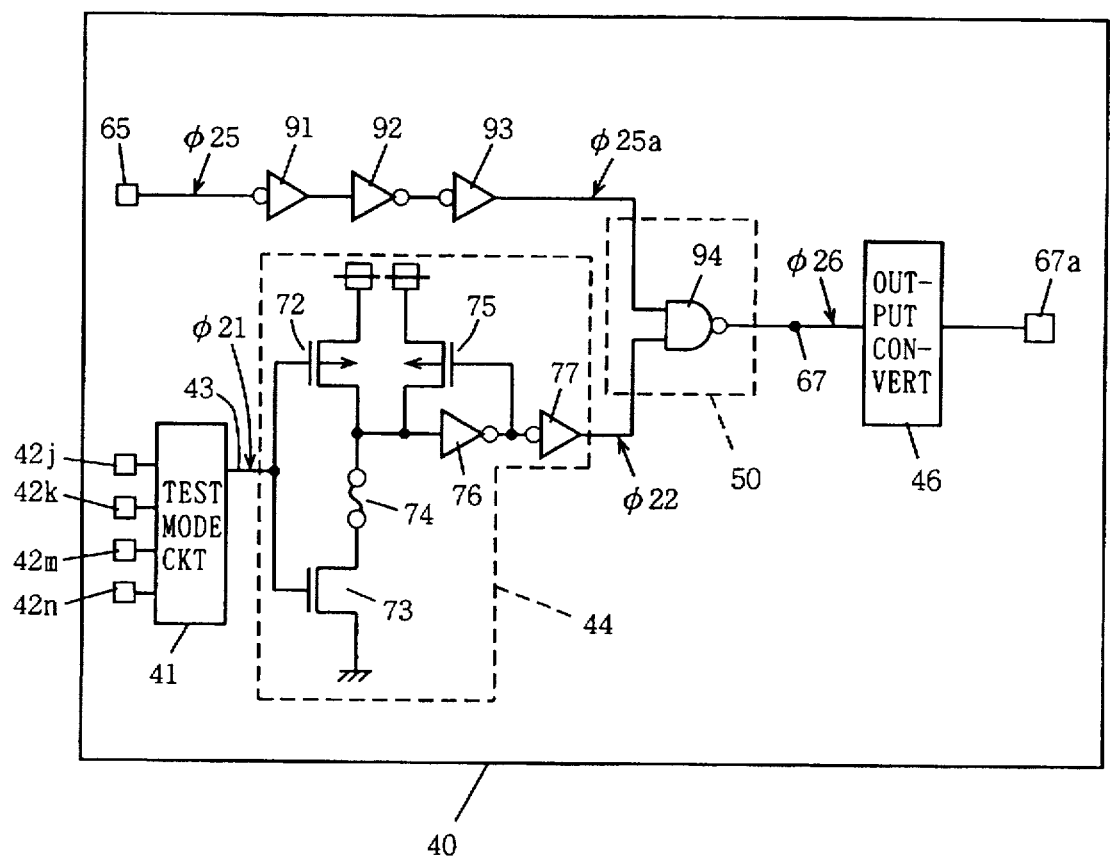
FIG. 12 shows in further detail the structure of the semiconductor integrated circuit device of FIG. 11.

FIG. 12 specifically shows a structure of combination circuit 50 of FIG. 11. Referring to FIG. 12, combination circuit 50 includes a 2-input NAND circuit 94 receiving signal φ25a corresponding to internal signal φ25 and signal φ22 output from pass/fail confirmation circuit 44. Signal φ25a is generated from signal φ25 via the cascaded three stages of inverter circuits 91, 92 and 93. The structure of pass/fail confirmation circuit 44 in FIG. 12 is similar to that shown in FIG. 6.

The operation of the semiconductor integrated circuit device shown in FIG. 12 will now be described in detail.

In a fuse blow test mode, signal φ21 from test mode circuit 41 is set at an H level. When fuse element 74 is not-blown off in this state, output signal φ22 from pass/fail confirmation circuit 44 attains an L level, and the output signal of NAND circuit 94 constantly attains an H level irrespective of the logic level of signal φ25 applied to input terminal 65. When fuse element 74 is cut off in a fuse blow test mode, output signal φ22 of pass/fail confirmation circuit 44 regularly attains an H level, and NAND circuit 94 functions as an inverter to invert signal φ25a and transmit the inverted signal onto internal node 67. Therefore, the signal on internal node 67 attains a logic level identical to that of signal φ25 applied to input terminal 65.

In a fuse blow test mode, the logic level of signal φ25 applied to input terminal 65 is altered. When fuse element 74 is not cut off, the signal on input node 67 regularly attains an H level regardless of change in logic level of signal φ25 applied to input terminal 65. When fuse element 74 is cut off and the semiconductor integrated circuit device is determined to be an acceptable product at the wafer level test, the signal on internal node 67 varies according to change in logic level of signal φ25 applied to input terminal 65. Output conversion circuit 46 has the structure shown in FIG. 6. Therefore, when fuse element 74 is cut off, the signal provided in an observable manner to output terminal 67a via output conversion circuit 46 varies according to the logic level of signal φ25 applied to input terminal 65. When fuse element 74 is cut off, the logic level of the observable signal applied to external terminal 67a is regularly constant regardless of change in logic level of signal φ25 applied to input terminal 65. Therefore, fuse element 74 can be reliably identified as being in a cut off state or a non-cut off state in a fuse blow test mode.

In modes other than the fuse blow test mode, signal φ21 attains an L level, and signal φ22 attains an H level. The logic level of signal φ26 of internal node 67 is identical to the logic level of signal φ25 applied to input terminal 65. Therefore, the required test can be executed properly even in the case where signal φ26 is a signal controlling activation/ inactivation of the internal power supply voltage-down converting circuit in output conversion circuit 46 or a signal that changes the voltage level of the internal power supply voltage output from the internal power supply voltage-down converting circuit according to an external power supply voltage in a particular test mode (burn-in mode test).

Figure 13:
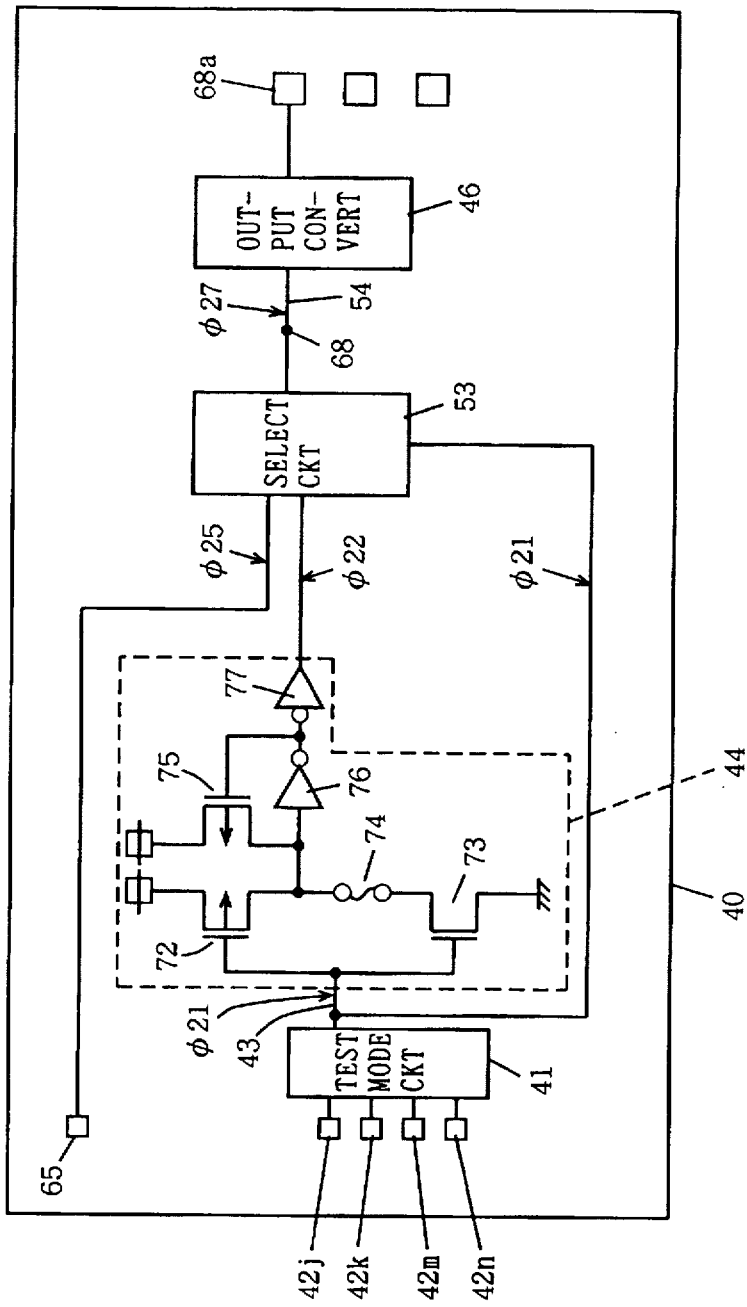
FIG. 13 schematically shows a structure of a second modification of a semiconductor integrated circuit device according to the present invention.

FIG. 13 schematically shows a further structure of a semiconductor integrated circuit device according to the present invention. In a semiconductor integrated circuit device 40 of FIG. 13, a select circuit 53 is provided between pass/fail confirmation circuit 44 and output conversion circuit 46 to select signal φ25 applied to input terminal (pad) 65 or output signal φ22 of pass/fail confirmation circuit 44 according to output signal φ21 of test mode circuit 41 to provide the selected signal to output conversion circuit 46 via signal line 54. The remaining structure is similar to that shown in FIGS. 5, 6, and 12, and corresponding components have the same reference characters allotted.

Select circuit 53 selects signal φ22 from pass/fail confirmation circuit 44 to apply the selected signal to output conversion circuit 46 via signal line 54 when a fuse blow test mode is specified. When output signal φ21 of test mode circuit 41 attains an L level and an operation mode other than the fuse blow test mode is specified, select circuit 53 selects signal φ25 applied to input terminal 65, which is applied to output conversion circuit 46 via signal line 54. Thus, in a fuse blow test mode, signal φ22 having a logic level set according to the state of conduction/non-conduction of fuse element 74 is applied to output conversion circuit 46. Similar to the previous embodiments, signal φ27 on node 28 is output to external terminal 68a in an observable manner by output conversion circuit 46 to detect conduction/non-conduction of fuse element 74 in pass/fail confirmation circuit 44.

Select circuit 53 selects and provides to output conversion circuit 46 signal φ25 applied to input terminal 65 in a mode other than the fuse blow test mode. When signal φ25 is a signal that controls activation/inactivation of the differential amplifier circuit in output conversion circuit 46, for example, or a signal for setting the internal power supply voltage to the level of external power supply voltage Vcc in a stress acceleration operation mode, the operation mode of the internal power supply voltage-down converting circuit in output conversion circuit 46 can be properly set according to signal φ25 applied to internal input terminal 65 in a normal operation mode (in a mode other than fuse blow test mode). Therefore, a test mode other than the fuse blow test mode can be executed reliably.

According to the structure shown in FIG. 13, signal φ21 attains an H level in a fuse blow test mode. When fuse element 74 is cut off, signal φ22 is fixed to an H level. When fuse element 74 is conductive, signal φ22 is set at an L level. Thus, proper identification of whether fuse element 74 is cut off or not can be made without adversely affecting the normal operation mode of the semiconductor integrated circuit device.

Figure 14:
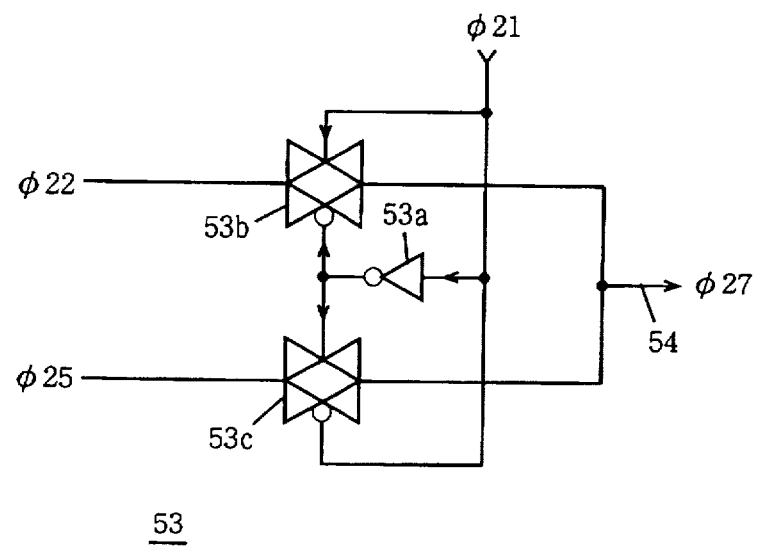
FIG. 14 shows an example of a structure of a selection circuit of a semiconductor integrated circuit device of FIG. 13.

FIG. 14 shows an example of a structure of select circuit 53 of FIG. 13. Referring to FIG. 14, select circuit 53 includes an inverter circuit 53a for inverting output signal φ21 of test mode circuit 41, a CMOS transmission gate 53b for selectively passing output signal φ22 of pass/fail confirmation circuit 44 according to signal φ21 and the output signal of inverter circuit 53a, and a CMOS transmission gate 53c selectively passing through signal φ25 applied to input terminal 65 according to signal φ21 and the output signal of inverter circuit 53a. The other output nodes of CMOS transmission gates 53b and 53c are connected together to signal line 45.

When signal φ21 attains an H level and a fuse blow test mode is specified, CMOS transmission gate 53b conducts, whereby signal φ22 from pass/fail confirmation circuit 44 is transmitted onto signal line 54 as signal φ27. When signal φ21 attains an L level to indicate an operation mode other than the fuse blow test mode, CMOS transmission gate 53c conducts. Signal φ25 applied to input terminal 65 is selected and transmitted onto signal line 54 as signal φ27.

In the structure of select circuit 53 of FIG. 14, a tristate buffer circuit can be used instead of the structure employing CMOS transmission gates 53b and 53c.

According to the present invention, a fuse element in a pass/fail confirmation circuit is cut off only in a semiconductor integrated circuit device determined to be an acceptable product in a wafer level test. Since cut off state of the fuse element is externally observable in a fuse blow test mode, identification of conduction/non-conduction of a fuse element can be made easily from the outside world without destroying the molding member in failure analysis.

Since only a semiconductor integrated circuit device determined to be an acceptable product in a wafer level test is subjected to a final test process, it is not necessary to carry out the further determination of an unacceptable product detected in the test of the wafer level during the final test step. Therefore, the test process can be simplified.

In the above description, a DRAM is taken as an example for a semiconductor integrated circuit device. However, the semiconductor integrated circuit device to which the present invention is applicable is not limited to a DRAM, and any semiconductor integrated circuit device is employable that is subject to testing at a wafer level and final testing at an individual chip level.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
   a test mode circuit responsive to a test mode designating signal for generating a test mode activation signal, and
   a pass/fail confirmation circuit including a fuse element that can be blown off, and responsive to activation of said test mode activation signal for providing a signal of logic level corresponding to a state in conduction or non-conduction of said fuse element,
   wherein said fuse element is blown off when said semiconductor integrated circuit device is determined to be an acceptable product in testing at a wafer level.

2. The semiconductor integrated circuit device according to claim 1, further comprising an output conversion circuit coupled to said pass/fail confirmation circuit for converting a signal output from said pass/fail confirmation circuit into a signal observable at a predetermined external terminal.

3. The semiconductor integrated circuit device according to claim 2, further comprising a combination circuit coupled between said pass/fail confirmation circuit and said output conversion circuit for combining a signal applied via a predetermined signal input terminal and the output signal of said pass/fail confirmation circuit for transmission to said output conversion circuit.

4. The semiconductor integrated circuit device according to claim 3, wherein said combination circuit comprises a logic gate that is selectively enabled and disabled according to a logic level of the output signal of said pass/fail confirmation circuit.

5. The semiconductor integrated circuit device according to claim 4, wherein said logic gate provides a signal of a logic level identical to the logic level of an input signal applied from said predetermined signal input terminal when the output signal of said pass/fail confirmation circuit attains a logic level corresponding to a blown off state of said fuse element in response to said test mode activation signal being active.

6. The semiconductor integrated circuit device according to claim 2, further comprising a select circuit receiving an output signal from a predetermined signal input terminal and the output signal of said pass/fail confirmation circuit, and responsive to activation of said test mode activation signal for selecting and providing to said output conversion circuit the output signal of said pass/fail confirmation circuit.

7. The semiconductor integrated circuit device according to claim 2, wherein said output conversion circuit comprises
   an internal power supply voltage-down converting circuit for down-converting a power supply voltage applied to a first external power supply node for generating an internal power supply voltage on an internal power supply line when activated, and
   a switching transistor activated complementarily to said internal power supply voltage-down converting circuit for supplying a current from a second external power supply node to said internal power supply line in activation thereof,
   wherein said internal power supply voltage-down converting circuit and said switching transistor are selectively activated and inactivated by the output signal of said pass/fail confirmation circuit.

8. The semiconductor integrated circuit device according to claim 3, wherein said output conversion circuit comprises;
   an internal power supply voltage-down converting circuit for down-converting a power supply voltage applied to a first external power supply node for generating an internal power supply voltage on an internal power supply line when activated, and
   a switching transistor activated complementarily to said internal power supply voltage-down converting circuit for supplying a current from a second external power supply node to said internal power supply line in activation thereof,
   wherein said internal power supply voltage-down converting circuit and said switching transistor are selectively activated and inactivated by the output signal of said combination circuit.

9. The semiconductor integrated circuit device according to claim 6, wherein said output conversion circuit comprises;
   an internal power supply voltage-down converting circuit for down-converting a power supply voltage applied to a first external power supply node for generating an internal power supply voltage on an internal power supply line when activated, and
   a switching transistor activated complementarily to said internal power supply voltage-down converting circuit for supplying a current to said internal power supply line from a second external power supply node when activated,
   wherein said internal power supply voltage-down converting circuit and said switching transistor are selectively activated and inactivated according to the output signal of said select circuit.

10. A pass/fail determination method of a semiconductor integrated circuit device, wherein said integrated semiconductor circuit device includes a fuse element for storing a pass/fail state of said semiconductor integrated circuit device, said method comprising:

a wafer test step of executing a function test on said semiconductor integrated circuit device in a state formed on a wafer, a fuse disconnect step of blowing off said fuse element in said semiconductor integrated circuit device when said semiconductor integrated circuit device is determined to be an acceptable product at said wafer test step, a packaging step of dicing said wafer to cut out said semiconductor integrated circuit device from said wafer, and sealing said semiconductor integrated circuit device a package only when said device is determined to be an acceptable product at said wafer test step, and a final test step of carrying out a function test on said semiconductor integrated circuit device packaged at said packaging step.

11. The pass/fail determination method according to claim 10, further comprising a fuse blow test step of setting the packaged semiconductor integrated circuit device to a fuse blow test mode of operation to measure a current or voltage of a predetermined pin terminal of said semiconductor integrated circuit device for determining whether said fuse element is blown off according to the result of measurement.

12. The pass/fail determination method according to claim 11, wherein said fuse blow test step comprises the step of measuring a current flowing through said predetermined pin terminal.

13. The pass/fail determination method according to claim 12, wherein said predetermined terminal is a power supply pin terminal to which an external power supply voltage is applied.

* * * * *